United States Patent
Cen et al.

(10) Patent No.: US 11,798,845 B2
(45) Date of Patent: Oct. 24, 2023

(54) METHODS AND APPARATUS FOR LOW RESISTIVITY AND STRESS TUNGSTEN GAP FILL

(71) Applicant: Applied Materials, Inc., Santa Clara, CA (US)

(72) Inventors: Xi Cen, San Jose, CA (US); Kai Wu, Palo Alto, CA (US); Min Heon, Los Gatos, CA (US); Wei Min Chan, Sunnyvale, CA (US); Tom Ho Wing Yu, Campbell, CA (US); Peiqi Wang, Campbell, CA (US); Ju Ik Kang, Seoul (KR); Feihu Wang, San Jose, CA (US); Nobuyuki Sasaki, Cupertino, CA (US); Chunming Zhou, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 106 days.

(21) Appl. No.: 17/082,602

(22) Filed: Oct. 28, 2020

(65) Prior Publication Data

US 2022/0130724 A1 Apr. 28, 2022

(51) Int. Cl.
*H01L 21/768* (2006.01)
*H01L 21/02* (2006.01)
*C23C 16/04* (2006.01)

(52) U.S. Cl.
CPC ...... *H01L 21/76879* (2013.01); *C23C 16/045* (2013.01); *H01L 21/0262* (2013.01)

(58) Field of Classification Search
CPC ............. H01L 29/66795; H01L 29/785; H01L 21/845; H01L 27/1211; H01L 29/66545
See application file for complete search history.

(56) References Cited

U.S. PATENT DOCUMENTS

| | | | |
|---|---|---|---|
| 6,492,281 B1* | 12/2002 | Song | H01L 21/32051 257/E21.582 |
| 9,589,808 B2 | 3/2017 | Bamnolker et al. | |
| 9,735,015 B1 | 8/2017 | Li et al. | |
| 10,256,142 B2* | 4/2019 | Chandrashekar | H01L 21/321 |
| 2005/0208763 A1 | 9/2005 | Byun | |

(Continued)

FOREIGN PATENT DOCUMENTS

EP    1094504 A2    4/2001

OTHER PUBLICATIONS

International Search Report for PCT/US2021/052336, dated Jan. 18, 2022.

*Primary Examiner* — Tony Tran
(74) *Attorney, Agent, or Firm* — MOSER TABOADA

(57) ABSTRACT

Method for forming tungsten gap fill on a structure, including high aspect ratio structures includes depositing a tungsten liner in the structure using a physical vapor deposition (PVD) process with high ionization and an ambient gas of argon or krypton. The PVD process is performed at a temperature of approximately 20 degrees Celsius to approximately 300 degrees Celsius. The method further includes treating the structure with a nitridation process and depositing bulk fill tungsten into the structure using a chemical vapor deposition (CVD) process to form a seam suppressed boron free tungsten fill. The CVD process is performed at a temperature of approximately 300 degrees Celsius to approximately 500 degrees Celsius and at a pressure of approximately 5 Torr to approximately 300 Torr.

13 Claims, 4 Drawing Sheets

(56) References Cited

U.S. PATENT DOCUMENTS

| | | |
|---|---|---|
| 2011/0233778 A1 | 9/2011 | Lee et al. |
| 2014/0154883 A1 | 6/2014 | Humayun et al. |
| 2016/0181151 A1 | 6/2016 | Chapple-Sokol et al. |
| 2018/0337052 A1 | 11/2018 | Ramalingam et al. |

* cited by examiner

METHODS AND APPARATUS FOR LOW RESISTIVITY AND STRESS TUNGSTEN GAP FILL

FIELD

Embodiments of the present principles generally relate to processing of semiconductor substrates.

BACKGROUND

Tungsten is used in the semiconductor industry as a low resistivity conductor with minimal electro-migration. Tungsten may be used to fill holes as contacts for transistors and in the formation of vias between layers of integrated devices. Tungsten may also be used for interconnects in logic and memory devices due to tungsten's stability and low resistivity. As technology progresses, a demand is created for even lower resistivity and lower stress metal fill solutions. Current technologies use a chemical vapor deposition of tungsten that requires the use of a titanium nitride liner and tungsten atomic layer deposition nucleation followed by a tungsten bulk fill. However, the current approaches are at the limits of the technologies and cannot provide a metal fill solution that has both lower resistivity and low stress with a reasonable gap fill.

Accordingly, the inventors have provided improved processes that yield a tungsten fill with low stress and even lower resistivity than current technologies.

SUMMARY

Methods and apparatus for reducing internal stresses of tungsten while lowering the tungsten's resistivity are provided herein.

In some embodiments, a method for forming tungsten gap fill on a structure may comprise depositing a tungsten liner in the structure using a physical vapor deposition (PVD) process, depositing a nucleation layer using an atomic layer deposition (ALD) process, treating the structure with a nitridation process, and depositing bulk fill tungsten into the structure using a chemical vapor deposition (CVD) process configured to form a seam suppressed tungsten fill.

In some embodiments, the method may further include wherein the nucleation layer is approximately 10 angstroms to approximately 60 angstroms in thickness, wherein the PVD process is a high ionization process with an ambient gas of argon or krypton, wherein the PVD process is performed at a temperature of approximately 20 degrees Celsius to approximately 300 degrees Celsius, wherein the CVD process is performed at a temperature of approximately 300 degrees Celsius to approximately 500 degrees Celsius, wherein the CVD process is performed at a pressure of approximately 5 Torr to approximately 300 Torr, wherein the structure is a high aspect ratio structure of approximately 8:1 to approximately 15:1, wherein the nitridation process includes flowing nitrogen at a rate of approximately 1 sccm to approximately 20 sccm, wherein the nitridation process has a duration of approximately 2 seconds to approximately 20 seconds, and/or wherein the tungsten liner is approximately 40 angstroms to approximately 60 angstroms in thickness.

In some embodiments, a method for forming tungsten gap fill on a structure may comprise depositing a tungsten liner in the structure using a physical vapor deposition (PVD) process with high ionization and an ambient gas of argon or krypton, wherein the PVD process is performed at a temperature of approximately 20 degrees Celsius to approximately 300 degrees Celsius, treating the structure with a nitridation process, and depositing bulk fill tungsten into the structure using a chemical vapor deposition (CVD) process to form a seam suppressed tungsten fill, wherein the CVD process is performed at a temperature of approximately 300 degrees Celsius to approximately 500 degrees Celsius and at a pressure of approximately 5 Torr to approximately 300 Torr.

In some embodiments, the method may further include performing a rapid thermal process (RTP) on the structure, wherein the RTP is configured to reduce internal stresses of the bulk fill tungsten and to lower resistivity of the bulk fill tungsten, wherein the RTP is performed at a temperature of approximately 700 degrees Celsius to approximately 900 degrees Celsius, wherein the RTP is performed for a time period of approximately 60 seconds or greater, wherein the RTP is performed by increasing a temperature at a ramping rate of approximately 30 degrees Celsius per second to approximately 100 degrees Celsius per second, wherein the bulk fill tungsten is boron free, and/or wherein the structure is a high aspect ratio structure of approximately 8:1 to approximately 15:1.

In some embodiments, a non-transitory, computer readable medium having instructions stored thereon that, when executed, cause a method for forming tungsten gap fill on a structure to be performed, the method may comprise depositing a tungsten liner in the structure using a physical vapor deposition (PVD) process with high ionization and an ambient gas of argon or krypton, wherein the PVD process is performed at a temperature of approximately 20 degrees Celsius to approximately 300 degrees Celsius, treating the structure with a nitridation process, and depositing bulk fill tungsten into the structure using a chemical vapor deposition (CVD) process to form a seam suppressed tungsten fill, wherein the CVD process is performed at a temperature of approximately 300 degrees Celsius to approximately 500 degrees Celsius and at a pressure of approximately 5 Torr to approximately 300 Torr.

In some embodiments, the method may further include depositing a nucleation layer using an atomic layer deposition (ALD) process prior to treating the structure with the nitridation process, and/or performing a rapid thermal process (RTP) on the structure, wherein the RTP is configured to reduce internal stresses of the bulk fill tungsten and to lower resistivity of the bulk fill tungsten.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
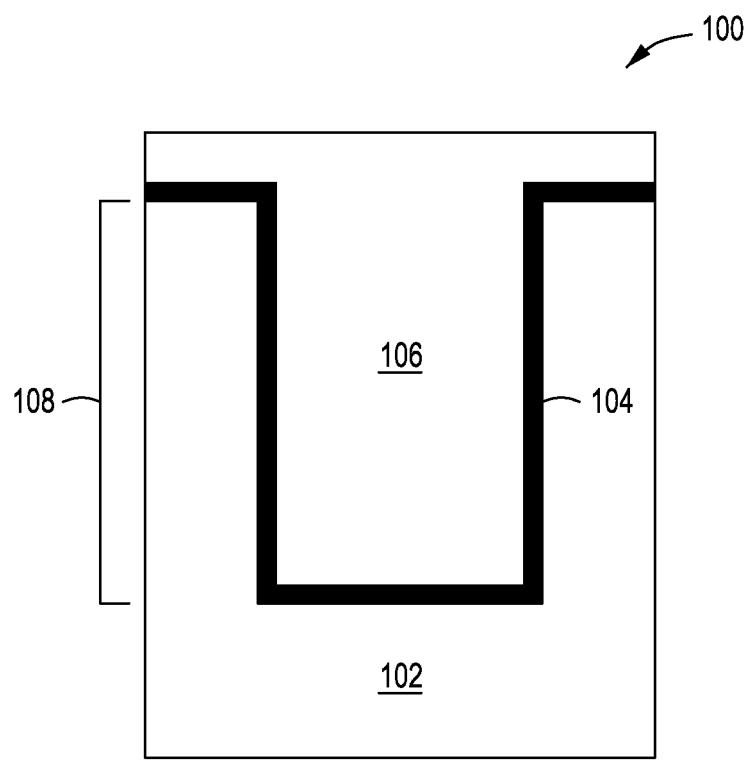
FIG. 1 depicts a cross-sectional view of a tungsten gap fill in a structure on a substrate according to some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a low resistivity and low stress tungsten gap fill. The present principles may be used to fill structures such as vias or trenches and the like. The critical dimensions (CD) of the trenches or vias may be within a range of approximately 5 nm to approximately 65 nm with aspect ratios (AR) of approximately 1:1 to approximately 15:1 (height to width ratio). In some embodiments, a process flow includes a physical vapor deposition (PVD) tungsten liner deposition, a chemical vapor deposition (CVD) of seam suppressed (SS) tungsten followed by a rapid thermal (RTP) annealing.

Tungsten is widely used as metallic interconnect in logic and memory devices, because of tungsten's unique stability and low resistivity. However, along with technological advances comes an increasing need for an even lower resistivity and lower stress metal fill solution with a reasonable gap fill that can meet, for example, requirements for NAND flash memory structures and similar. Conventional CVD tungsten approaches (TiN+CVD tungsten) have high tensile stress. The inventors have found that the stress of CVD tungsten can be lowered by changing deposition conditions (temperature, pressure, and tungsten fluoride ($WF_6$) to hydrogen ($H_2$) gas ratio, etc.), but with a large impact on throughput and gap fill performance. The inventors also found that the resistivity of CVD tungsten can be lowered by changing deposition conditions (temperature, tungsten atomic layer deposition (ALD) nucleation chemistry, etc.), but with a limited resistivity response and decreased performance (mainly throughput). The inventors subsequently discovered an integrated approach that greatly lowers the stress and resistivity of tungsten films with high throughput. In addition, the tungsten fill is boron free, allowing the use of a rapid thermal process with no adhesion issues in the integrated approach.

FIG. 1 depicts a cross-sectional view 100 of a tungsten gap fill in a structure 108 in a substrate 102 according to some embodiments. In a conventional tungsten gap fill process, a titanium nitride layer is first deposited on the surface of the substrate followed by an ALD tungsten nucleation layer and a CVD tungsten gap fill. With the methods and apparatus of the present principles, a PVD tungsten liner 104 is first deposited in the structure 108 and then a tungsten bulk fill 106 is deposited by a CVD tungsten/SS tungsten process. In some embodiments, an RTP process may be used subsequently to decrease resistivity and stress of the tungsten bulk fill 106. The PVD tungsten liner 104 will have reasonable step coverage in the structure 108. The PVD deposition is conducted with a high ionization process with an ambient noble gas such as argon or krypton and the like. Temperature during the PVD deposition process may be from approximately room temperature (~20 degrees Celsius) to approximately 300 degrees Celsius.

Conventional CVD tungsten gap fill on a titanium nitride layer consists of a tungsten ALD nucleation using tungsten fluoride and diborane ($B_2H_6$)/silane (SiH4) precursors and tungsten CVD bulk fill deposition with $WF_6/H_2$ as precursors. In the methods and apparatus of the present principles, tungsten CVD bulk fill is deposited directly without a tungsten ALD nucleation layer with a temperature of approximately 300 degrees Celsius to approximately 500 degrees Celsius and a pressure of approximately 5 Torr to approximately 300 Torr. The elimination of the use of boron in the process allows an RTP process to be used to improve the resistivity and stress levels in the tungsten without causing boron-promoted adhesion issues with the tungsten. The annealing temperature may range from approximately 700 degrees Celsius to approximately 900 degrees Celsius. The annealing duration may be approximately 60 seconds or greater. The annealing ambient gas may be hydrogen or argon and the like. In some embodiments, the temperature ramping rate may range from approximately 30 degrees Celsius per second to approximately 100 degrees Celsius per second or more.

Figure 2:
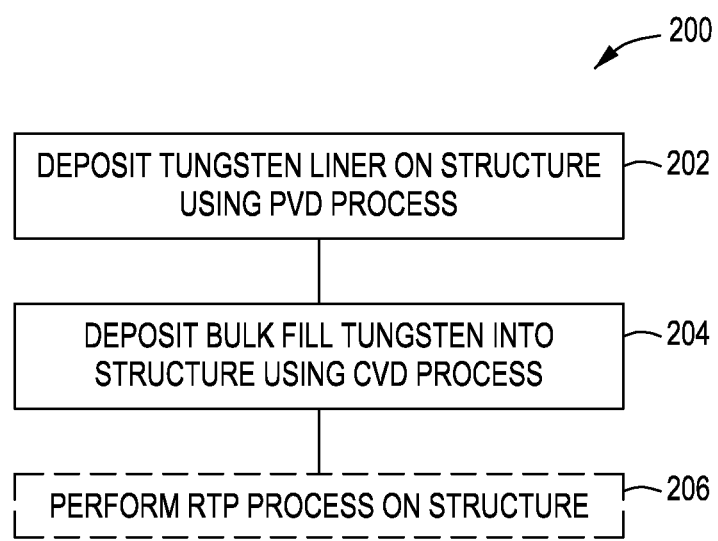
FIG. 2 is a method of filling gaps on a substrate in accordance with some embodiments of the present principles.
Figure 3:
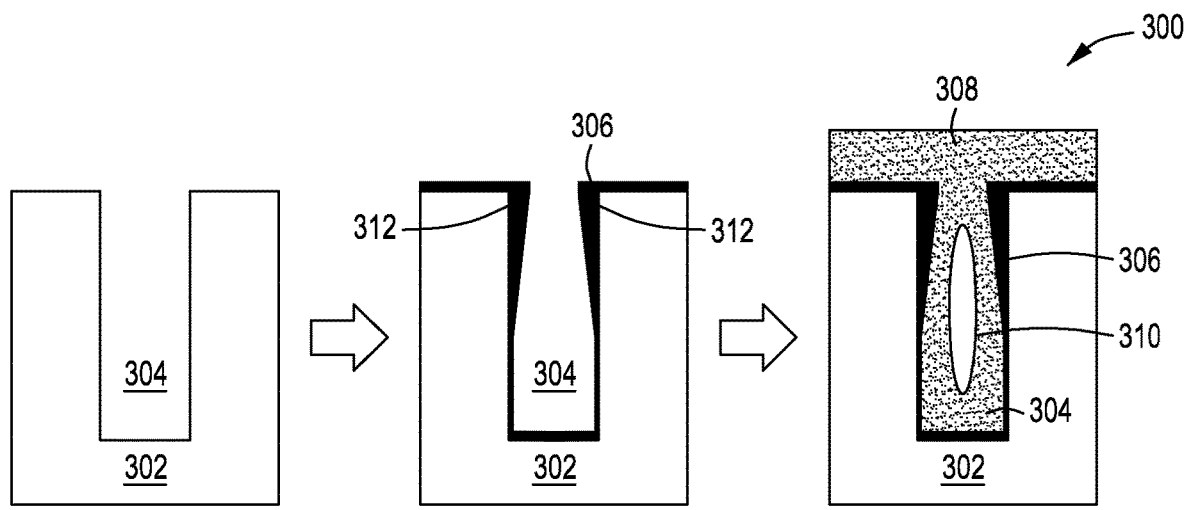
FIG. 3 depicts a cross-sectional view of a high aspect ratio structure being gap filled in accordance with some embodiments of the present principles.

FIG. 2 is a method 200 of filling gaps on a substrate in accordance with some embodiments. FIG. 3 depicts a cross-sectional view 300 of a structure 304 in a substrate 302 being gap filled in accordance with the method 200. In block 202, a tungsten liner 306 is deposited on the structure 304 using a PVD process. As noted previously, the PVD process is conducted with high ionization using a noble gas such as argon or krypton and the like. The PVD process temperature may be from approximately room temperature (~20 degrees Celsius) to approximately 300 degrees Celsius. A thickness of the tungsten liner 306 depends on CD variation and may range from approximately 40 angstroms to approximately 200 angstroms. In block 204, bulk fill tungsten 308 is deposited on the structure 304 using a CVD process with a precursor of $WF_6$ with hydrogen gas, filling the structure 304 with boron free tungsten. The CVD process may be performed at a temperature of approximately 300 degrees Celsius to approximately 500 degrees Celsius and with a pressure of approximately 5 Torr to approximately 300 Torr.

In optional block 206, an RTP process may be performed on the structure 304 to reduce internal stresses of the bulk fill tungsten 308 while also reducing the resistivity of the bulk fill tungsten 308. The bulk fill tungsten 308 is deposited without the use of boron and issues associated with RTP processes of boron infused tungsten are avoided. As described above, the annealing temperature may range from approximately 700 degrees Celsius to approximately 900 degrees Celsius. The annealing duration may be approximately 60 seconds or greater. The annealing ambient gas may be hydrogen or argon and the like. In some embodiments, the temperature ramping rate may range from approximately 30 degrees Celsius per second to approximately 100 degrees Celsius per second or more. The method 200 works well for structures with aspect ratios of less than 8:1. The inventors have found that if the high aspect ratio is too great (e.g., 8:1 to 15:1), a void 310 may appear in the bulk fill tungsten 308 due the formation of overhangs 312 during the PVD tungsten deposition and due to the conformal nature of the bulk fill tungsten 308. In order to overcome the formation of voids in the structure 304, the inventors have discovered alternative methods that may be used for higher aspect ratios as described in FIGS. 4 and 6.

Figure 4:
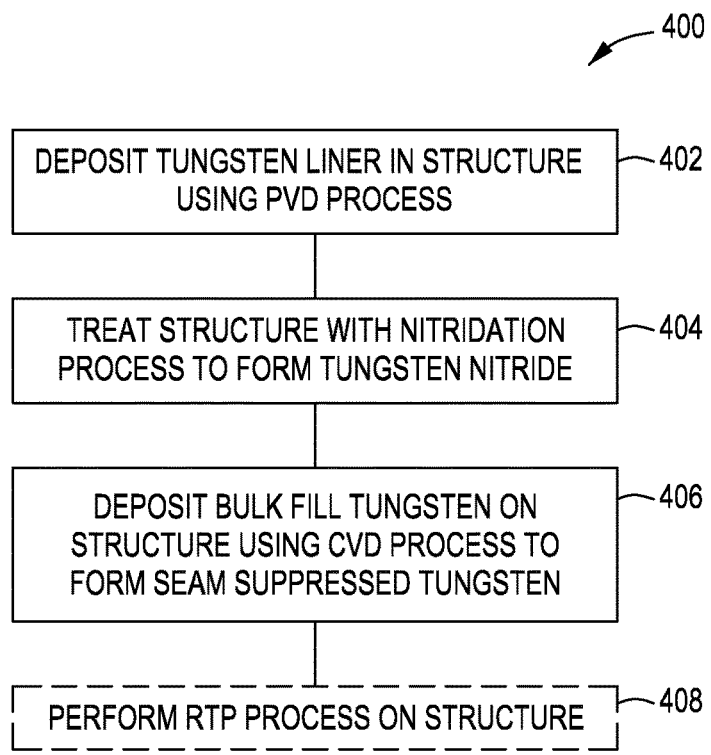
FIG. 4 is a method of filling gaps on a substrate using a nitridation process in accordance with some embodiments of the present principles.
Figure 5:
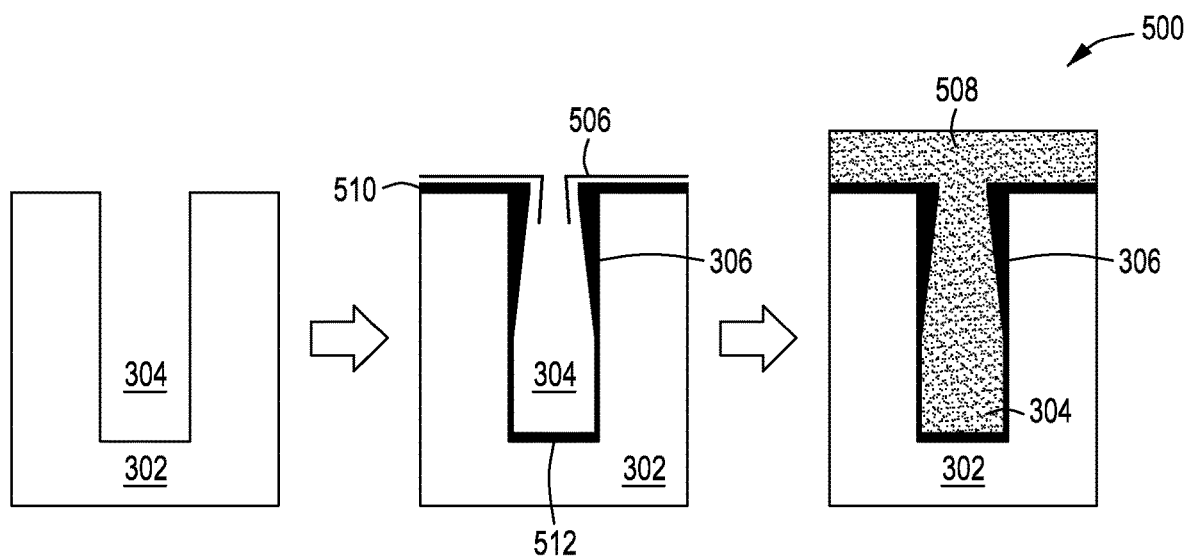
FIG. 5 depicts a cross-sectional view of a high aspect ratio structure being gap filled without voids in accordance with some embodiments of the present principles.

FIG. 4 is a method 400 of filling gaps on the substrate 302 using a nitridation process in accordance with some embodiments. FIG. 5 depicts a cross-sectional view 500 of the structure 304 being gap filled without voids in accordance with the method 400. In block 402, a tungsten liner 306 is deposited on the structure 304 using a PVD process. A thickness of the tungsten liner 306 depends on CD variation and may range from approximately 40 angstroms to approximately 200 angstroms. The tungsten liner 306 acts as a nucleation layer for the subsequent bulk fill. The PVD process is conducted with high ionization using a noble gas such as argon or krypton and the like. The PVD process temperature may be from approximately room temperature (~20 degrees Celsius) to approximately 300 degrees Celsius. In block 404, the structure 304 is treated with a nitridation process to form tungsten nitride 506. In the nitridation process, nitrogen radicals form the tungsten nitride only on or near a top surface 510 of the structure 304. The tungsten nitride causes the subsequent CVD tungsten deposition to have an incubation delay on the top surface 510, but the CVD tungsten deposition will have normal growth from the bottom 512 and upward inside of the structure 304. The nitridation process results in a bottom-up or super-conformal deposition behavior of the CVD tungsten deposition to reduce void formation inside of the structure 304. In some embodiments, the nitridation process includes flowing nitrogen at a rate of approximately 1 sccm to approximately 20 sccm with a duration of approximately 2 seconds to approximately 20 seconds. A local or remote plasma source may be used.

In block 406, bulk fill tungsten 508 is deposited on the structure 304 using a CVD process to form seam suppressed tungsten. The CVD process uses a precursor of $WF_6$ with hydrogen gas to form boron free tungsten. The CVD process may be performed at a temperature of approximately 300 degrees Celsius to approximately 500 degrees Celsius and with a pressure of approximately 5 Torr to approximately 300 Torr. In optional block 408, an RTP process may be performed on the structure 304 to reduce internal stresses of the bulk fill tungsten 508 while also reducing the resistivity of the bulk fill tungsten 508. The bulk fill tungsten 508 is deposited without the use of boron and issues associated with RTP processes of boron infused tungsten are avoided. The annealing temperature may range from approximately 700 degrees Celsius to approximately 900 degrees Celsius. The annealing duration may be approximately 60 seconds or greater. The annealing ambient gas may be hydrogen or argon and the like. In some embodiments, the temperature ramping rate may range from approximately 30 degrees Celsius per second to approximately 100 degrees Celsius per second or more.

Figure 6:
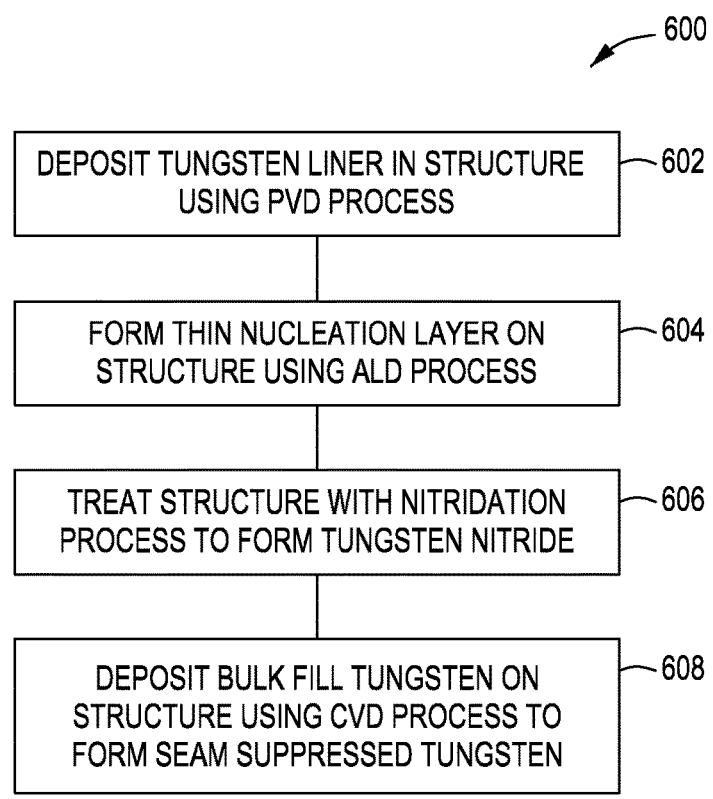
FIG. 6 is a method of filling gaps on a substrate using an ALD nucleation layer process in accordance with some embodiments of the present principles.
Figure 7:
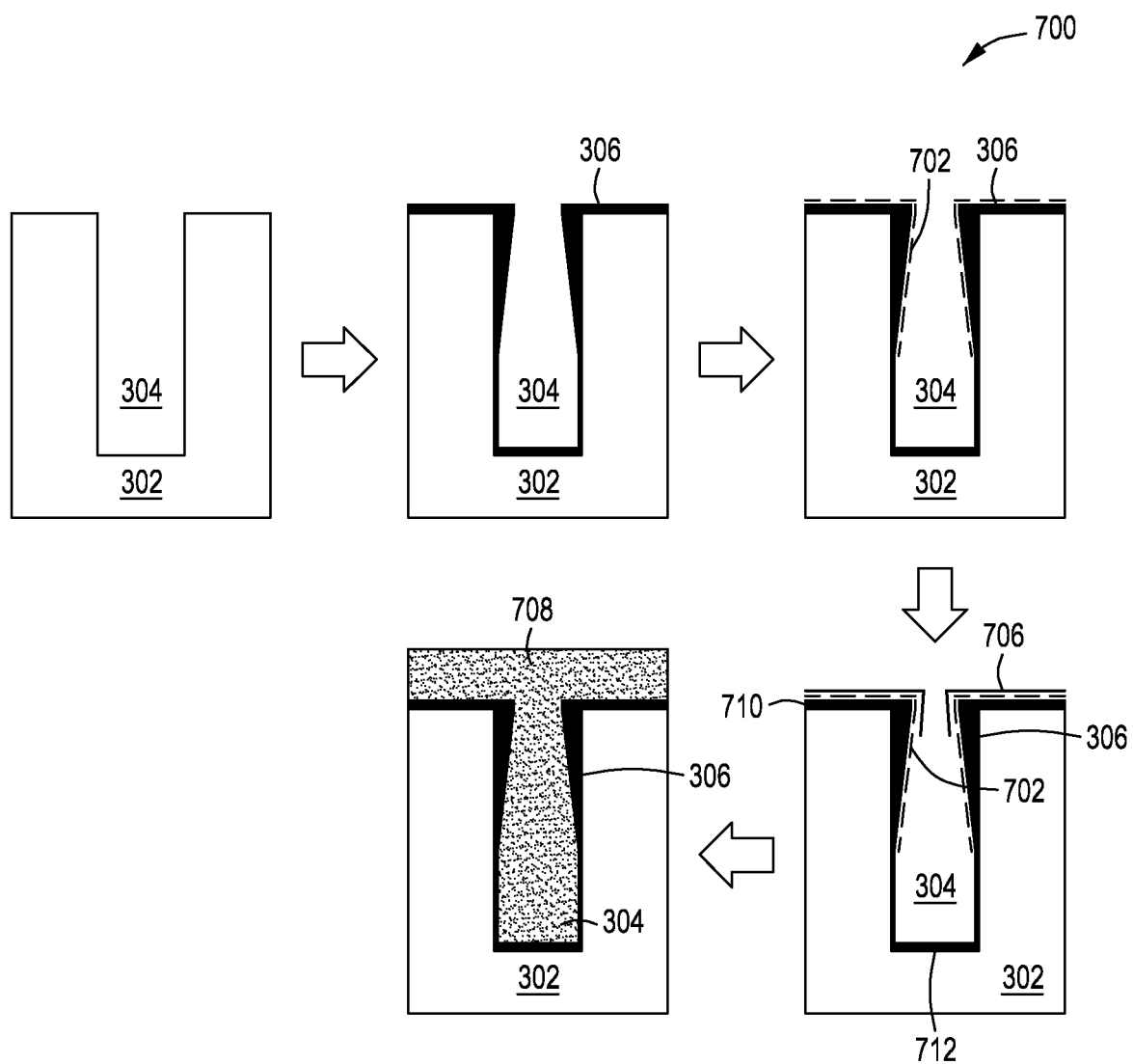
FIG. 7 depicts a cross-sectional view of a high aspect ratio structure being gap filled using an ALD nucleation layer in accordance with some embodiments of the present principles.

FIG. 6 is a method of filling gaps on the substrate 302 using an ALD nucleation layer process in accordance with some embodiments. FIG. 7 depicts a cross-sectional view 700 of the structure 304 being gap filled using an ALD nucleation layer in accordance with the method 600. In block 602, a tungsten liner 306 is deposited on the structure 304 using a PVD process. A thickness of the tungsten liner 306 depends on CD variation and may range from approximately 40 angstroms to approximately 200 angstroms. The PVD process is conducted with high ionization using a noble gas such as argon or krypton and the like. The PVD process temperature may be from approximately room temperature (~20 degrees Celsius) to approximately 300 degrees Celsius.

In block 604, a thin tungsten nucleation layer 702 is formed on the structure 304 using an ALD process. The thickness of the thin tungsten nucleation layer 702 may be from approximately 10 angstroms to approximately 60 angstroms. The tungsten nucleation layer is applied before the nitridation treatment to enhance the incubation delay on the top surface 710. The internal stress level of subsequently deposited bulk fill tungsten will remain the same, but the resistivity of the subsequently deposited bulk fill tungsten may increase approximately 10% compared to processes without the ALD process.

In block 606, the structure 304 is treated with a nitridation process to form a tungsten nitride layer 706. In the nitridation process, nitrogen radicals form the tungsten nitride only on or near the top surface 710 of the structure 304. The tungsten nitride layer 706 causes the subsequent CVD tungsten deposition to have an incubation delay on the top surface 710, but the CVD tungsten deposition will have normal growth from the bottom 712 and upwards inside of the structure 304. The nitridation process results in a bottom-up or super-conformal deposition behavior of the CVD tungsten deposition to reduce void formation inside of the structure 304. In some embodiments, the nitridation process includes flowing nitrogen at a rate of approximately 1 sccm to approximately 20 sccm with a duration of approximately 2 seconds to approximately 20 seconds. A local or remote plasma source may be used. In block 608, bulk fill tungsten 708 is deposited on the structure 304 using a CVD process to form seam suppressed tungsten. The CVD process uses a precursor of $WF_6$ with hydrogen gas. The CVD process may be performed at a temperature of approximately 300 degrees Celsius to approximately 500 degrees Celsius and with a pressure of approximately 5 Torr to approximately 300 Torr.

Even without incorporating an RTP process in some of the embodiments of the methods described above, internal stresses (measured in MPa) of the tungsten bulk fill were reduced approximately 10% (film thickness above 2000 angstroms) to approximately 50% (film thickness at 500 angstroms or less) or more over conventional processes, with the largest reductions for thinner films. At the same time, resistivity of the tungsten bulk fill was reduced by approximately 30% to approximately 40% or more over conventional processes. The additional RTP process in some embodiments of the methods described above further reduced the internal stresses and further decreased the resistivity of the tungsten bulk fill over conventional processes with a thermal treatment. The RTP process reduced the internal stresses of the tungsten bulk fill from approximately 45% to approximately 55% or more for all thicknesses over conventional processes. The RTP process reduced the resistivity of the tungsten bulk fill from approximately 35% to approximately 45% or more over conventional processes. In addition, the methods of the present principles do not have degraded adhesion issues after the annealing process like those found in conventional processes using boron derivatives.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming tungsten gap fill on a structure, comprising the following in sequential order:
   (a) depositing a tungsten liner in the structure using a physical vapor deposition (PVD) process, wherein the tungsten liner is approximately 40 angstroms to approximately 60 angstroms in thickness;
   (b) depositing a nucleation layer on the tungsten liner using an atomic layer deposition (ALD) process;
   (c) treating the structure with a nitridation process to form a tungsten nitridation layer on the nucleation layer, wherein the nitridation process includes flowing nitrogen at a rate of approximately 1 sccm to approximately 20 sccm; and
   (d) depositing bulk fill tungsten into the structure after the nitridation process using a chemical vapor deposition (CVD) process configured to form a seam suppressed tungsten fill, wherein the CVD process is performed at a pressure of approximately 5 Torr to approximately 300 Torr.

2. The method of claim 1, wherein the nucleation layer is approximately 10 angstroms to approximately 60 angstroms in thickness.

3. The method of claim 1, wherein the PVD process is a high ionization process with an ambient gas of argon or krypton.

4. The method of claim 1, wherein the PVD process is performed at a temperature of approximately 20 degrees Celsius to approximately 300 degrees Celsius.

5. The method of claim 1, wherein the CVD process is performed at a temperature of approximately 300 degrees Celsius to approximately 500 degrees Celsius.

6. The method of claim 1, wherein the structure is a high aspect ratio structure of approximately 8:1 to approximately 15:1.

7. The method of claim 1, wherein the nitridation process has a duration of approximately 2 seconds to approximately 20 seconds.

8. The method of claim 1,
   wherein the PVD process is performed at a temperature of approximately 20 degrees Celsius to approximately 300 degrees Celsius; and
   wherein the CVD process is performed at a temperature of approximately 300 degrees Celsius to approximately 500 degrees Celsius.

9. The method of claim 1, further comprising:
   performing a rapid thermal process (RTP) on the structure, wherein the RTP is configured to reduce internal stresses of the bulk fill tungsten and to lower resistivity of the bulk fill tungsten.

10. The method of claim 9, wherein the RTP is performed at a temperature of approximately 700 degrees Celsius to approximately 900 degrees Celsius.

11. The method of claim 9, wherein the RTP is performed for a time period of approximately 60 seconds or greater.

12. The method of claim 9, wherein the RTP is performed by increasing a temperature at a ramping rate of approximately 30 degrees Celsius per second to approximately 100 degrees Celsius per second.

13. The method of claim 1, wherein the bulk fill tungsten is boron free.

* * * * *